United States Patent
Lin et al.

(10) Patent No.: US 10,690,143 B2
(45) Date of Patent: Jun. 23, 2020

(54) VANE, FAN BLADE AND FAN INCLUDING THE SAME

(71) Applicant: Cooler Master Co., Ltd., New Taipei (TW)

(72) Inventors: Tsung-Wei Lin, New Taipei (TW); Chun-Hsien Chen, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 82 days.

(21) Appl. No.: 16/103,162

(22) Filed: Aug. 14, 2018

(65) Prior Publication Data

US 2019/0368505 A1     Dec. 5, 2019

(30) Foreign Application Priority Data

Jun. 4, 2018   (CN) .................... 2018 2 0852102 U

(51) Int. Cl.
*F04D 29/38*     (2006.01)
*H05K 7/20*      (2006.01)
*F04D 19/00*     (2006.01)

(52) U.S. Cl.
CPC ......... *F04D 29/384* (2013.01); *F04D 19/002* (2013.01); *H05K 7/20145* (2013.01); *H05K 7/20172* (2013.01)

(58) Field of Classification Search
CPC ..... F01D 9/02; F01D 5/00; F01D 5/08; F01D 11/001; F01D 25/04; F01D 25/24; F05D 2220/323; F05D 2240/55; F05D 2250/283; F05D 2260/96; F05D 2260/963; F02C 7/24; F04D 29/66; F04D 29/663; F04D 29/664; F04D 29/386; F05B 2240/302
USPC ............. 416/175, 203, 183, 235, 236 R, 237
See application file for complete search history.

(56) References Cited

U.S. PATENT DOCUMENTS

| | | | | |
|---|---|---|---|---|
| 1,055,947 A | * | 3/1913 | Schwartzberg | F04D 25/088 416/62 |
| 1,745,441 A | * | 2/1930 | Norberg | F04D 29/325 416/183 |
| 2,540,136 A | * | 2/1951 | Oliphant | F04D 29/281 416/179 |
| 3,149,823 A | * | 9/1964 | Entrikin | B01F 7/00466 416/183 |
| 3,953,552 A | * | 4/1976 | Strauss | B03D 1/16 261/93 |
| 4,265,596 A | * | 5/1981 | Katagiri | F04D 29/384 416/175 |
| 4,293,280 A | * | 10/1981 | Yim | B63H 1/26 416/175 |

(Continued)

*Primary Examiner* — Kenneth Bomberg
*Assistant Examiner* — Hakeem M Abdellaoui
(74) *Attorney, Agent, or Firm* — Locke Lord LLP; Tim Tingkang Xia, Esq.

(57) ABSTRACT

A fan blade includes a hub and a plurality of vanes. The vanes are connected to the hub. Each of the vanes includes a main body and a guide plate. The main body has an inflow surface and an outflow surface. The guide plate is disposed on the outflow surface. When the fan blade rotates, an airflow occurs and flows into a side of the fan blade via the inflow surface, and the guide plate guides part of the airflow to flow out of another side of the fan blade in a first direction and a second direction so as to cool an electronic component disposed adjacent to the another side of the fan blade.

14 Claims, 6 Drawing Sheets

(56) References Cited

U.S. PATENT DOCUMENTS

| | | | | |
|---|---|---|---|---|
| 5,215,441 A * | 6/1993 | Evans | ............... | F04D 29/384 |
| | | | | 416/223 R |
| 5,368,508 A * | 11/1994 | Whittington | ............ | B63H 1/26 |
| | | | | 416/236 A |
| 6,863,500 B2 * | 3/2005 | Jung | ................ | F04D 29/384 |
| | | | | 415/218.1 |
| 2002/0159885 A1 * | 10/2002 | Liang | ................ | F04D 17/162 |
| | | | | 415/206 |
| 2005/0063825 A1 * | 3/2005 | Yang | ................ | F04D 29/325 |
| | | | | 416/183 |
| 2006/0204363 A1 * | 9/2006 | Yen | .................. | F04D 29/281 |
| | | | | 416/228 |
| 2009/0311093 A1 * | 12/2009 | Otsuki | .............. | F04D 25/0613 |
| | | | | 415/203 |
| 2011/0103966 A1 * | 5/2011 | John | .................. | F01D 5/225 |
| | | | | 416/235 |
| 2014/0086754 A1 * | 3/2014 | Seiji | ................. | F04D 29/384 |
| | | | | 416/237 |
| 2018/0149168 A1 * | 5/2018 | Yu | ......................... | G06F 1/20 |

* cited by examiner

VANE, FAN BLADE AND FAN INCLUDING THE SAME

CROSS-REFERENCE TO RELATED APPLICATIONS

This non-provisional application claims priority under 35 U.S.C. § 119(a) on Patent Application No(s). 201820852102.X filed in China on Jun. 4, 2018, the entire contents of which are hereby incorporated by reference.

TECHNICAL FIELD

The disclosure relates to a vane, a fan blade and a fan including the same, more particularly to a vane, a fan blade and a fan including the same able to change airflow direction.

BACKGROUND

With the development of electronic device technology, the requirements of heat dissipation efficiency of electronic devices are more demanding. Conventionally, an electronic device is usually equipped with a fan to remove heat generated therein. Please refer to FIG. 1 and FIG. 2. FIG. 1 shows a perspective view of a conventional fan blade, and FIG. 2 illustrates airflow flowing through the fan blade. As shown in FIGS. 1 and 2, the fan blade 1 includes a hub 11 and a plurality of vanes 12. The vanes 12 are connected to the hub 11. Each of the vanes 12 has an inflow surface 121 and an outflow surface 122.

When the fan blade 1 rotates, the airflow S flows into a side of the fan blade 1 via the inflow surfaces 121, and the vanes 12 guide the airflow S to flow out of another side of the fan blade 1 in a second direction F2 to cool an electronic component 3 disposed adjacent to the another side of the fan blade 1, wherein the second direction F2 points towards the periphery of the electronic component 3. Obviously, the airflow S is not efficiently used for cooling the electronic component; furthermore, the airflow S generated by such fan blade is uneven. Therefore, in view of the foregoing, a fan blade and a fan including the same that can solve the aforementioned issues would be desirable.

SUMMARY

The present disclosure provides a vane, a fan blade and a fan including the same, which are able to focus on cooling one or more particular electronic components and generate an even airflow.

One embodiment of the disclosure provides a fan blade. The fan blade includes a hub a plurality of vanes. The vanes are connected to the hub. Each of the vanes includes a main body and a guide plate. The main body has an inflow surface and an outflow surface. The guide plate is disposed on the outflow surface of the main body. When the fan blade rotates, an airflow occurs and flows into a side of the fan blade via the inflow surface, and the guide plate guides part of the airflow to flow out of another side of the fan blade in a first direction and a second direction so as to cool an electronic component disposed adjacent to the another side of the fan blade.

One embodiment of the disclosure provides a fan. The fan includes the aforementioned fan blade.

One embodiment of the disclosure provides a vane, which is adapted to be connected to a hub. The vane includes a main body and a guide plate. The main body is configured to be connected to the hub. The main body has an inflow surface and an outflow surface. The guide plate is disposed on the outflow surface of the main body.

According to the vane, the fan blade and the fan including the same as described above, it becomes possible to generate an even airflow on one or more particular electronic components, thereby improving the heat dissipation efficiency.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
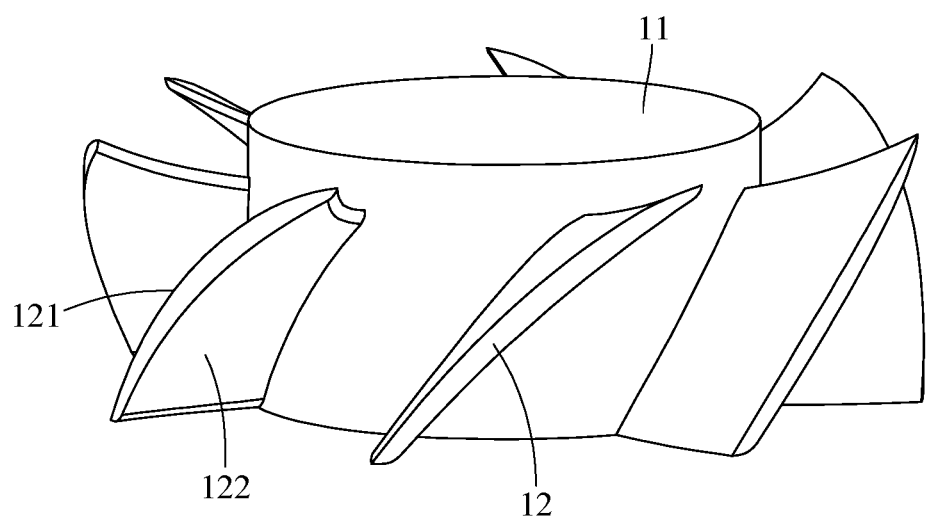
FIG. 1 is a perspective view of a conventional fan blade.
Figure 2:
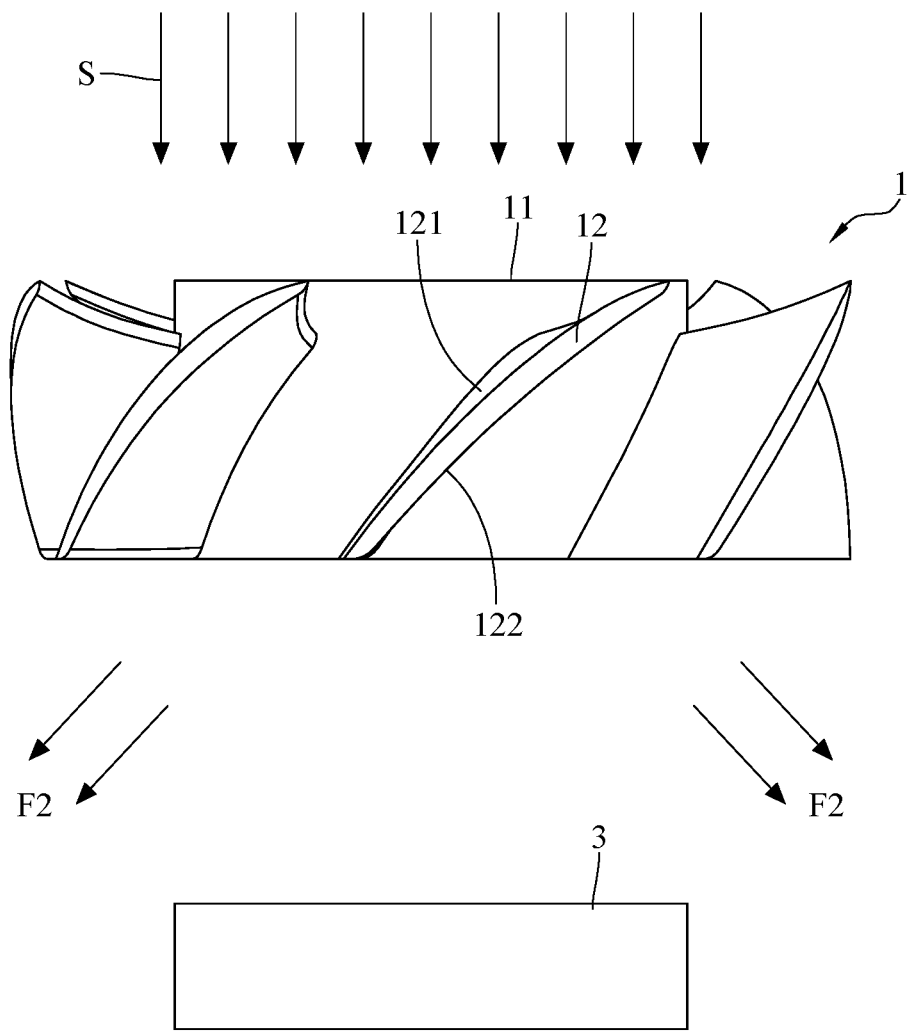
FIG. 2 illustrates airflow flowing through the fan blade of FIG. 1 where an electronic component is located at a side of the fan blade.

In the following detailed description, for purposes of explanation, numerous specific details are set forth in order to provide a thorough understanding of the disclosed embodiments. It will be apparent, however, that one or more embodiments may be practiced without these specific details. In other instances, well-known accommodation structures and devices are schematically shown in order to simplify the drawing.

Figure 3:
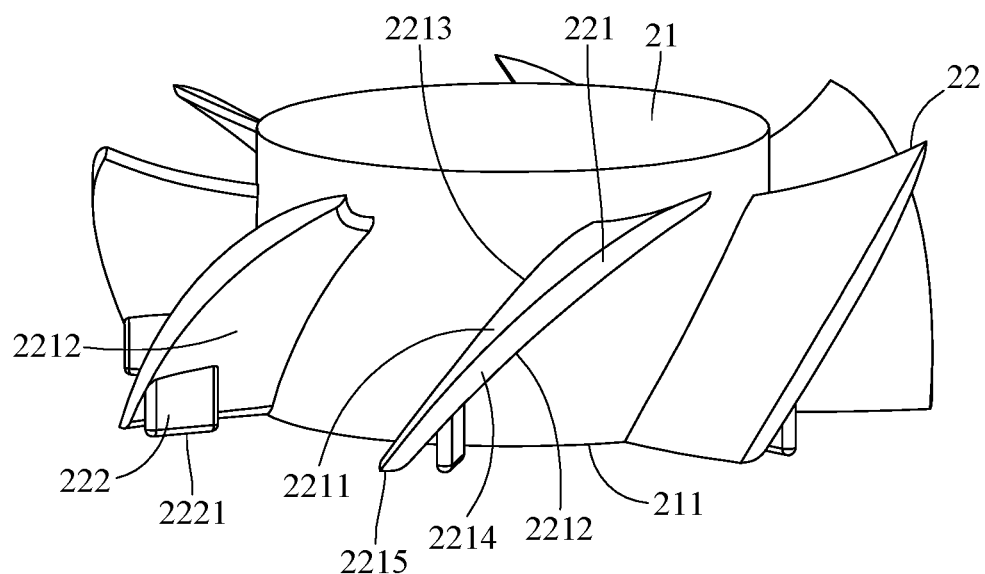
FIG. 3 is a perspective view of a fan blade in accordance with a first embodiment of the present disclosure.
Figure 4:
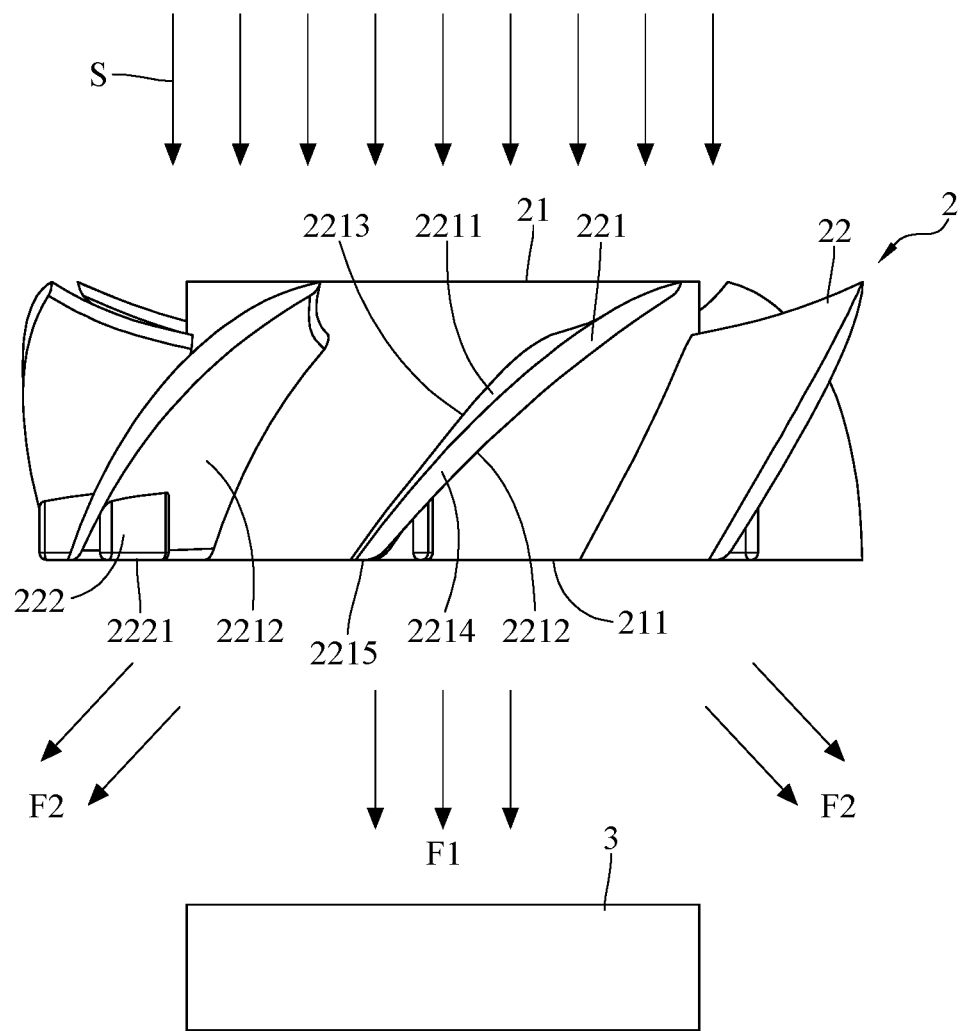
FIG. 4 illustrates airflow flowing through the fan blade of FIG. 3 where the electronic component is located at a side of the fan blade.

Please refer to FIG. 3 and FIG. 4. FIG. 3 is a perspective view of a fan blade in accordance with a first embodiment of the present disclosure, and FIG. 4 illustrates airflow flowing through the fan blade of FIG. 3 where the electronic component is located at a side of the fan blade.

As shown in FIG. 3 and FIG. 4, this embodiment provides a fan blade 2 which includes a hub 21 and a plurality of vanes 22. The vanes 22 are connected to the hub 21. Each of the vanes 22 includes a main body 221 and a guide plate 222. The main body 221 has an inflow surface 2211 and an outflow surface 2212. The inflow surface 2211 is, for example, convex, and the outflow surface 2212 is, for example, concave. The guide plate 222 is disposed on the outflow surface 2212. When the fan blade 2 rotates, an airflow S occurs and flows into a side of the fan blade 2 via the inflow surfaces 2211, and the guide plates 222 guide part of the airflow S to flow out of another side of the fan blade 2 in a first direction F1 and a second direction F2 in order to cool an electronic component 3 disposed adjacent to the another side of the fan blade 2. The first direction F1 points from the vanes 22 towards the electronic component 3 and is perpendicular to the electronic component 3, and the second direction F2 points from the vanes 22 towards the periphery of the electronic component 3.

In addition, in this embodiment, the main body 221 and the guide plate 222 are made of a single piece, but the present disclosure is not limited thereto. In other embodiments, the main body 221 and the guide plate 222 may be two independent components that are assembled together.

Furthermore, the main body 221 further has a first lateral edge 2213 and a second lateral edge 2214 opposite to each other. The first lateral edge 2213 and the second lateral edge 2214 are respectively located on two opposite sides of the inflow surface 2211 and the outflow surface 2212. The first lateral edge 2213 is connected to the hub 21. The guide plate 222 extends from the second lateral edge 2214 toward the first lateral edge 2213 but is separate from the first lateral edge 2213. However, the present disclosure is not limited thereto. In another embodiment, the guide plate may extend from the first lateral edge toward the second lateral edge and be separate from the second lateral edge. Moreover, the guide plate 222 also protrudes in a direction parallel to a central axis of the hub 21.

Additionally, in this embodiment, a bottom surface 2221 of the guide plate 222 and a bottom surface 2215 of the main body 221 are coplanar, but the present disclosure is not limited thereto. In other embodiments, the bottom surface of the guide plate and the bottom surface of the main body may be non-coplanar. Further, in this embodiment, the bottom surface 2221 of the guide plate 222 and a bottom surface 211 of the hub 21 are also coplanar, but the present disclosure is not limited thereto. In other embodiments, the bottom surface of the guide plate and the bottom surface of the hub may be non-coplanar.

Figure 5:
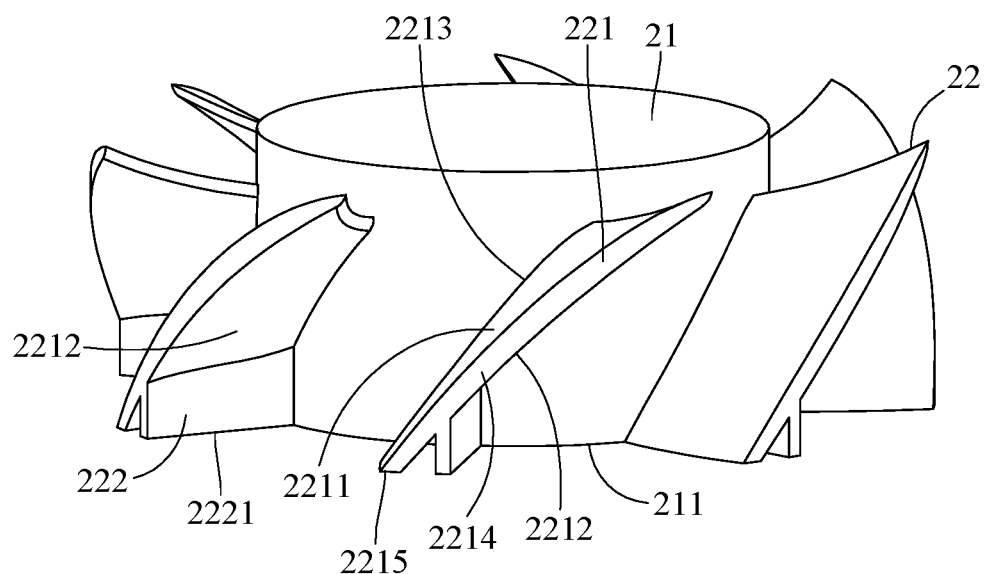
FIG. 5 is a perspective view of a fan blade in accordance with a second embodiment of the present disclosure.
Figure 6:
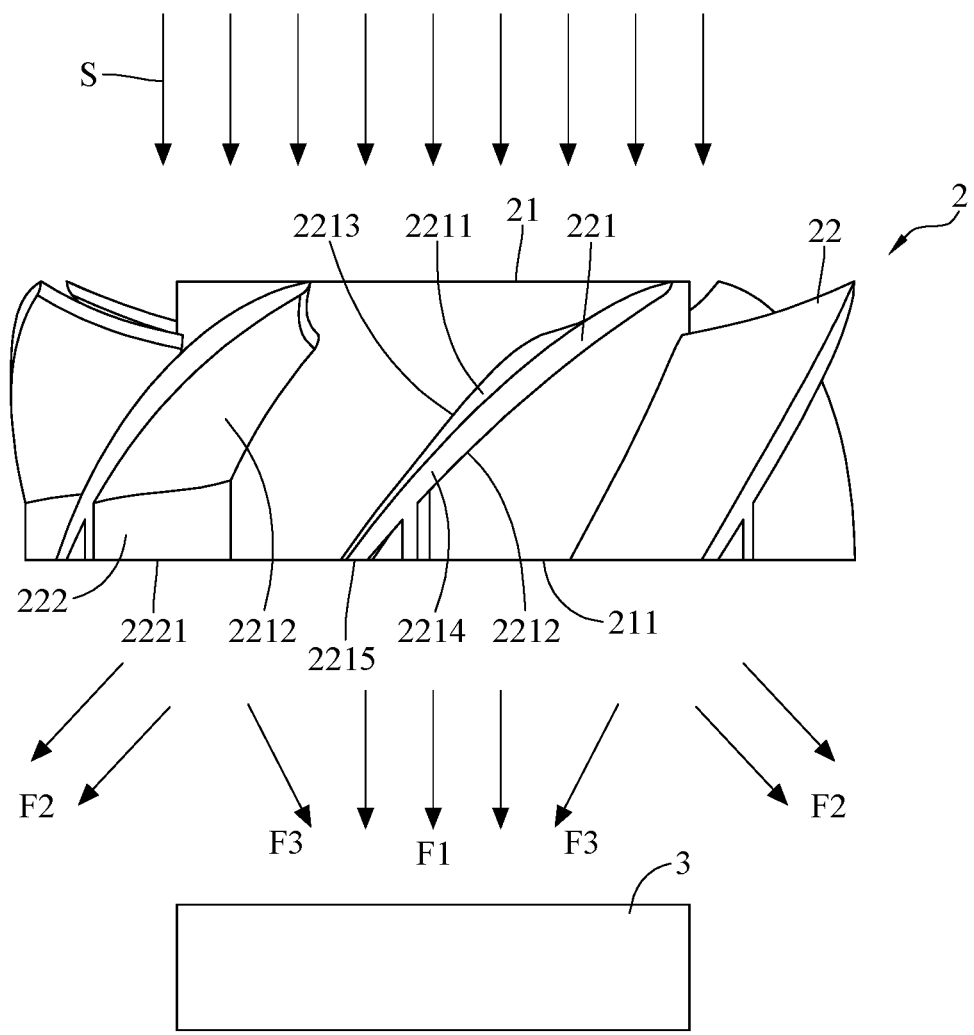
FIG. 6 illustrates airflow flowing through the fan blade of FIG. 5 where the electronic component is located at a side of the fan blade.

Please refer to FIG. 5 and FIG. 6. FIG. 5 is a perspective view of a fan blade in accordance with a second embodiment of the present disclosure, and FIG. 6 illustrates airflow flowing through the fan blade of FIG. 5 where the electronic component is located at a side of the fan blade.

This embodiment provides a fan blade 2 which has a configuration similar to that of the fan blade 2 of the first embodiment, thus only the differences between these two fan blades 1 will be described in detail below. As seen in FIG. 5 and FIG. 6, in this embodiment, a main body 221 further has a first lateral edge 2213 and a second lateral edge 2214 opposite to each other. The first lateral edge 2213 and the second lateral edge 2214 are respectively located on two opposite sides of an inflow surface 2211 and an outflow surface 2212. The first lateral edge 2213 is connected to a hub 21. A guide plate 222 extends from the second lateral edge 2214 toward the first lateral edge 2213 and is connected to the hub 21. With such configuration, when the fan blade 2 rotates, an airflow S occurs and flows into a side of the fan blade 2 via the inflow surfaces 2211, and the guide plates 222 guide part of the airflow S to flow out of the another side of the fan blade 2 in a first direction F1, a second direction F2 and a third direction F3 in order to cool an electronic component 3 disposed adjacent to the another side of the fan blade 2. The first direction F1 points from the vanes 22 towards the electronic component 3 and is perpendicular to the electronic component 3, the second direction F2 points from the vanes 22 towards the periphery of the electronic component 3, and the third direction F3 points towards the middle portion of the electronic component 3.

In this embodiment, a bottom surface 2221 of the guide plate 222, a bottom surface 2215 of the main body 221 and a bottom surface 211 of the hub 21 are all coplanar, but the present disclosure is not limited thereto.

Moreover, the present disclosure also provides a fan which is adapted to be mounted in an electronic device and includes one of the aforementioned fan blades 2 so as to cool one or more electronic components in the electronic device.

According to the vane, the fan blade and the fan including the same as described above, it becomes possible to generate an even airflow on one or more particular electronic components, thereby improving the heat dissipation efficiency.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A fan blade, comprising:
a hub; and
a plurality of vanes, connected to the hub, each of the plurality of vanes comprising:
a main body, having an inflow surface and an outflow surface; and
a guide plate, disposed on the outflow surface of the main body, wherein when the fan blade rotates, an airflow occurs and flows into a side of the fan blade via the inflow surface, and the guide plate guides part of the airflow to flow out of another side of the fan blade in a first direction and a second direction so as to cool an electronic component disposed adjacent to the another side of the fan blade;
wherein the main body has a first lateral edge and a second lateral edge opposite to each other, the first lateral edge is configured to be connected to the hub, the guide plate extends from the second lateral edge toward the first lateral edge, and the guide plate and the first lateral edge are separate from each other.

2. The fan blade according to claim 1, wherein when the fan blade rotates, the airflow occurs and flows into the side of the fan blade via the inflow surface, and the guide plate guides part of the airflow to flow out of the another side of the fan blade in the first direction, the second direction and a third direction so as to cool the electronic component disposed adjacent to the another side of the fan blade.

3. The fan blade according to claim 2, wherein the first direction points from the plurality of vanes towards the electronic component and is perpendicular to the electronic component, the second direction points from the plurality of vanes towards a periphery of the electronic component, and the third direction points from the plurality of vanes to a middle portion of the electronic component.

4. The fan blade according to claim 1, wherein a bottom surface of the guide plate and a bottom surface of the main body are coplanar, and the guide plate protrudes from a plane where a bottom surface of the hub is located.

5. The fan blade according to claim 1, wherein a bottom surface of the guide plate, a bottom surface of the main body and a bottom surface of the hub are coplanar.

6. The fan blade according to claim 1, wherein the guide plate protrudes in a direction parallel to a central axis of the hub.

7. The fan blade according to claim 1, wherein the main body and the guide plate are made of a single piece.

8. The fan blade according to claim 1, wherein the inflow surface is convex, and the outflow surface is concave.

9. A fan, comprising the fan blade of claim 1.

10. A vane, adapted to be connected to a hub, the vane comprising:
a main body, configured to be connected to the hub, and the main body having an inflow surface and an outflow surface; and
a guide plate, disposed on the outflow surface of the main body;

wherein the main body has a first lateral edge and a second lateral edge opposite to each other, the first lateral edge is configured to be connected to the hub, the guide plate extends from the second lateral edge toward the first lateral edge, and the guide plate and the first lateral edge are separate from each other.

11. The vane according to claim 10, wherein a bottom surface of the guide plate and a bottom surface of the main body are coplanar.

12. The vane according to claim 10, wherein the guide plate protrudes in a direction parallel to a central axis of the hub.

13. The vane according to claim 10, wherein the main body and the guide plate are made of a single piece.

14. The vane according to claim 10, wherein the inflow surface is convex, and the outflow surface is concave.

* * * * *